United States Patent
Mahoney (10) Patent No.: US 7,864,083 B2
(45) Date of Patent: Jan. 4, 2011

(54) EFFICIENT DATA COMPRESSION AND DECOMPRESSION OF NUMERIC SEQUENCES

(75) Inventor: Matthew Mahoney, Melbourne, FL (US)

(73) Assignee: Ocarina Networks, Inc., San Jose, CA (US)

( * ) Notice: Subject to any disclaimer, the term of this patent is extended or adjusted under 35 U.S.C. 154(b) by 34 days.

(21) Appl. No.: 12/470,469

(22) Filed: May 21, 2009

(65) Prior Publication Data

US 2009/0289819 A1  Nov. 26, 2009

Related U.S. Application Data

(60) Provisional application No. 61/055,101, filed on May 21, 2008.

(51) Int. Cl.
*H03M 7/30* (2006.01)

(52) U.S. Cl. .......................................... 341/87; 341/51

(58) Field of Classification Search ................. 341/87, 341/51, 65, 76, 50; 370/474, 477; 382/236
See application file for complete search history.

(56) References Cited

U.S. PATENT DOCUMENTS

| | | | | |
|---|---|---|---|---|
| 6,125,348 | A * | 9/2000 | Levine | 704/500 |
| 6,253,222 | B1 * | 6/2001 | Dyer et al. | 708/203 |
| 6,396,420 | B1 * | 5/2002 | Augustine | 341/50 |

* cited by examiner

*Primary Examiner*—Brian Young
(74) *Attorney, Agent, or Firm*—Weaver Austin Villeneuve & Sampson LLP (57) ABSTRACT

Embodiments described herein relate to compression and decompression of data consisting of a one dimensional time series of floating point numbers. A compressor may comprise a lossless stage and in some embodiments a lossy stage in addition to the lossless stage. The lossy stage quantizes the data by discarding some of the least significant bits as specified by the user. The lossless stage uses a context mixing algorithm with two bit-wise predictive models whose predictions are combined and fed to an arithmetic coder. One model is a direct context model using the most significant bits of prior numeric samples as context. The other model is the output of an adaptive filter, in which the approximate predicted numeric value is used as context to model the actual value. A corresponding decompressor uses the same lossless model with the arithmetic coder replaced by an arithmetic decoder.

7 Claims, 4 Drawing Sheets

EFFICIENT DATA COMPRESSION AND DECOMPRESSION OF NUMERIC SEQUENCES

CROSS-REFERENCE TO RELATED APPLICATIONS

This application claims the benefit of U.S. Provisional Patent Application No. 61/055,101, filed May 21, 2008 entitled "Data Compression Methods" to Matthew Mahoney. This application is incorporated in its entirety by reference as if fully set forth herein.

BACKGROUND OF THE INVENTION

Time series data, such as seismic data etc. were previously compressed in the "steim1" or "steim2" formats as specified by the Incorporated Research Institutions for Seismology (IRIS). These formats are specified as part of the SEED format, first published Feb. 25, 1988. In steim1 format, each 32 bit integer numeric value is delta coded by replacing it with the difference between the current and previous value. This generally results in numbers closer to zero because the original analog signal does not change much between samples. Then whenever four successive values can represented in 8 bits or less, or two successive values can be represented in 16 bits or less, these values are packed into a single 32 bit word. An additional 2 bits are needed to record which packing format was used. These additional bits are packed into a separate 16 bit word. The steim2 format is based on a similar idea, but allows delta coded values to be encoded and packed using 4, 5, 6, 8, 10, 15, or 30 bits per value.

Time series data is also compressed with a general purpose data compressors utilizing mixing algorithms or filtering techniques often used to compress audio files.

SUMMARY OF THE INVENTION

Computer systems configured to compress and decompress large files are disclosed, along with the associated techniques of compression and decompression. The computer system incorporates a compressor and a decompressor.

One aspect relates to a computing device. The computing device incorporates a model that receives as input a sequence of bits representing a time sequence of measurements as concatenated floating point numbers, and outputs before each input bit a number which represents the probability that the next bit will be a 0 or 1 (a bit prediction). The model comprises two or more independent submodels, one or more adaptive filters, and a mixer, where each adaptive filter inputs a sequence of prior measurements and outputs an estimate of the next measurement as a weighted average of past measurements. Each submodel takes as input a context consisting of a hash of some previously predicted bits or of the output of one or more adaptive filters or both.

The submodels each comprise a hash table and a prediction table such that the hash table takes as input a context and outputs a numeric value representing a count of 0 and 1 bits previously input in the same context or an exact sequence of one or more of the most recently seen bits in the same context or both (a bit history). The prediction table takes as input the bit history and outputs a number representing the probability that the next bit will be a 0 or 1 (a bit prediction), where the mixer takes as input the bit predictions from said submodels and outputs a bit prediction computed as a nonlinear transform of a weighted average of nonlinear transforms of each of the submodel predictions. After each input bit the bit histories of all submodels are updated to a new state that increases the count of the last input bit and/or decreases one or both counts and/or appends the last input bit to the stored bit sequence and/or removes one or more older bits from the sequence, updates the used entry in the prediction table of each submodel in the direction that would have reduced its prediction error (where prediction error means the difference between the input bit minus the previously computed probability that that bit would be a 1), updates the mixer weights each in the direction that would have reduced its prediction error, and after the last bit of each measurement, updates the weights of the adaptive filters in the direction that would have reduced their prediction errors.

The model may also incorporate a sequence of one or more secondary symbol estimators ("SSEs") such that each SSE takes its input from the previous SSE and outputs to the next SSE in the sequence, except that the output of the model described above is connected to the input of the first SSE, and the output of the last SSE is the output of the model of this claim, where each SSE takes as input a bit prediction and a context consisting of a function of previous input bits and outputs a new bit prediction computed by quantizing the input prediction, selecting two output predictions from a table indexed by the context and the two nearest quantized values and computing the output by interpolation between them. After each input bit the model is updated as described above, and one or both of the two selected table entries in each SSE are adjusted in the direction that would have reduced the prediction error for that SSE.

Another aspect relates to a lossless data compressor which takes as input a time sequence of measurements from a seismograph. The measurements are represented as floating point numbers, and the compressor outputs a compressed representation of the data. The compressor comprises a serializer, the model described above, and an arithmetic coder. The serializer takes as input a floating point number and outputs the bits of the number according to the aforementioned model and the arithmetic coder. The arithmetic coder takes as input the bit predictions of the model and the bits to be coded from the serializer and outputs compressed data.

One aspect relates to a mixer that comprises a single layer neural network trained to minimize coding cost. The mixer combines predictions by weighted averaging in the logistic domain. Given a set of n predictions $p(1) \ldots p(n)$, the mixer outputs $pm = \text{squash}(\Sigma\, w(i)\, \text{stretch}(p(i)))$ where the sum is over $i=1 \ldots n$, $w(i)$ is the i'th weight, $\text{stretch}(p)=\log(p/(1-p))$, and $\text{squash}(x)=\text{stretch}^{-1}(x)=1/(1+e^{-x})$. After the bit is coded, the weights $w(i)$ are adjusted to favor the most accurate models: $w(i) := w(i) + L(y-pm)\, \text{stretch}(p(i))$, where L is the learning rate, typically 0.001 to 0.005, y is the coded bit, pm is the output of the mixer (thus $y-pm$ is the prediction error), and := denotes assignment. In addition, the set of weights $w(1) \ldots w(n)$ may be selected from one row of a two dimensional table by a context that is independent of the individual model contexts to further improve compression.

The mixer output prediction pm may be further refined by one or more secondary symbol estimation stages. SSE inputs a prediction and a context that may be independent of the model and mixer contexts. The input prediction is quantized and used to select a pair of adjacent predictions in a 2 dimensional table. The output is interpolated between these two predictions. After coding, one or both entries is adjusted to reduce the prediction error. The table is initialized so that input and output predictions are equal.

An arithmetic coder encodes a bit with probability p using very nearly $\log_2 1/p$ output bits, which would be optimal. It does this by maintaining a range (low, high), initially (0, 1), and as its final output, encodes the bit sequence as a fractional binary number within the final range. Each bit, y, is encoded by splitting the range into two parts in proportion to the two probabilities P(y=0) and P(y=1). Then the range is reduced by retaining only the half corresponding to y.

Decoding proceeds as follows. The predictor, which includes the set of models, mixer, and optional SSE stages, makes an identical series of predictions using the decoded output bit stream as input. These predictions are fed to an arithmetic decoder, which takes the compressed data stream as input. The decoder, like the encoder, maintains a range (low, high), initially (0, 1), and makes an identical series of range splits and reductions. To decode a bit, the input number is compared with the two halves of the split. If the input is in the half corresponding to P(y=0), then a 0 is output, else a 1 is output, and the selected half becomes the new range.

The second compression method mentioned is an adaptive filter. Here, a predictor estimates successive values in a numeric sequence, and the difference or prediction error is encoded. Compression is achieved because the error is generally closer to 0 than the original value, so it can be encoded using fewer bits.

An n-tap adaptive filter takes as input a numeric sequence $x(1), x(2), \ldots, x(k)$ and outputs a prediction:

$$z(k+1) = \Sigma i=0 \ldots n-1 \; w(i)x(k-i)$$

After a prediction, the weights $w(i)$ are adjusted to reduce the prediction error $err=x(k+1)-z(k+1)$. This may be done in various ways, generally by increasing $w(i)$ in proportion to $x(k-i) \cdot err$.

A further understanding of the nature and advantages of the present invention may be realized by reference to the remaining portions of the specification and the drawings.

DETAILED DESCRIPTION OF THE PREFERRED EMBODIMENTS

Reference will now be made in detail to specific embodiments of the invention including the best modes contemplated by the inventors for carrying out the invention. Examples of these specific embodiments are illustrated in the accompanying drawings. While the invention is described in conjunction with these specific embodiments, it will be understood that it is not intended to limit the invention to the described embodiments. On the contrary, it is intended to cover alternatives, modifications, and equivalents as may be included within the spirit and scope of the invention as defined by the appended claims. In the following description, specific details are set forth in order to provide a thorough understanding of the present invention. The present invention may be practiced without some or all of these specific details. In addition, well known features may not have been described in detail to avoid unnecessarily obscuring the invention.

Figure 2:
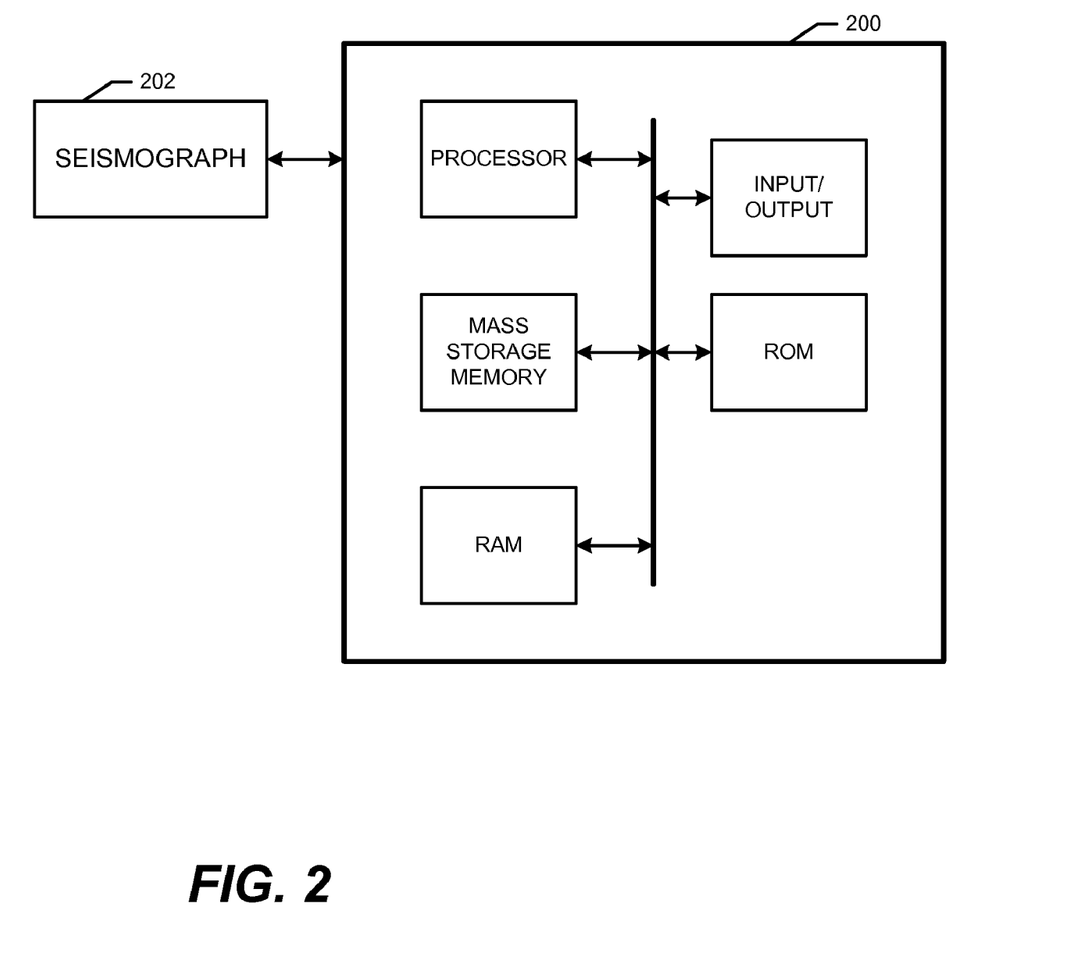
FIG. 2 illustrates a computer system according to an embodiment of the invention.

Computer systems configured to compress and decompress large files are disclosed, along with the associated techniques of compression and decompression. An exemplary embodiment of a computer system configured to compress data in the manner described above is shown in FIG. 2. Computer 200 comprises one or more microprocessors, a mass storage memory, random access memory, read only memory, and input/output connections for sending and receiving data, including peripherals to display and control devices such as a keyboard, and mouse etc. Computer 200 is configured to receive and process a sequence of floating point numbers from any source of such a sequence, for example, from a seismograph 202. In one embodiment, the components of computer 200 and seismograph 202 are incorporated into one purpose built computing device for measuring and recording compressed seismographic data.

The data to be compressed/decompressed may be in a variety of formats, but the described embodiments are particularly effective at compressing and depict compression of a sequence of 32 bit floating point numbers.

In some environments or scenarios, such data represents measurements recorded by a seismograph at regular intervals and recorded in a file, as mentioned above. Such data, as one may imagine is rather voluminous and benefits immensely from compression. The values may be recorded either in IBM format or IEEE format. IBM format consists of a sign bit, 7 exponent bits, and 24 mantissa bits, where the exponent represents a power of 16. IEEE format consists of a sign bit, 8 exponent bits, and 23 mantissa bits, where the exponent represents a power of 2. In addition, a data file may contain a header consisting of arbitrary information. An example of a data file format applicable is the SEG-Y format as defined by the Society of Exploration Geologists. The invention should of course not be limited to such formats or structures, and is defined by the appended claims and equivalents thereof.

Embodiments utilize a content mixing algorithm that uses two or more models to predict the next bit of data. Predicting the next bit of data is advantageous because the most appropriate compression technique can be employed to compress or code the next bit/bitstream of data.

Figure 1A:
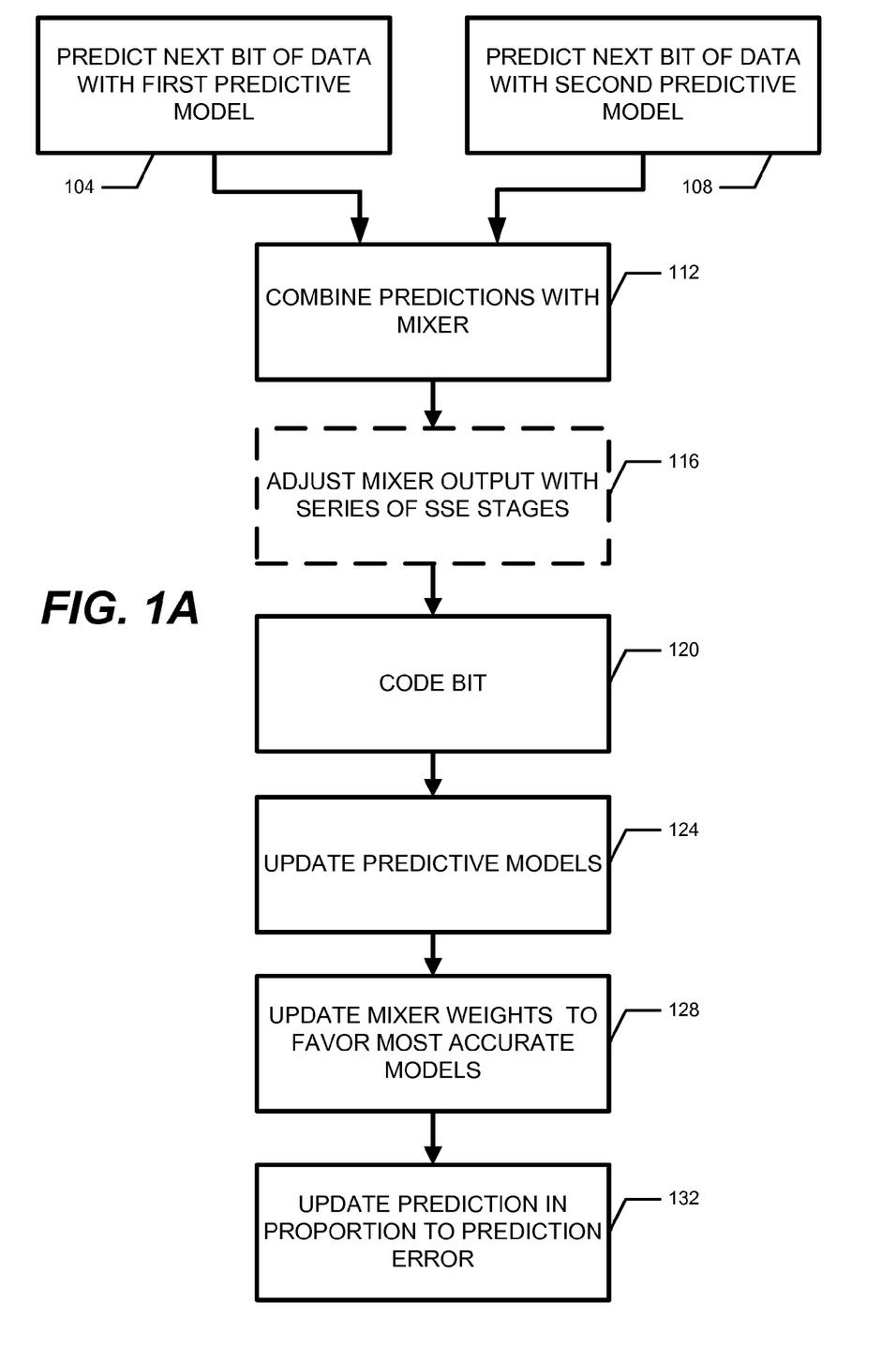
FIG. 1A is a flow chart depicting compression according to an embodiment of the invention.

FIG. 1A is a flow chart illustrating a general overview of a compression technique according to an embodiment of the invention. As seen in FIG. 1A the system will predict the next bit of data with a first predictive model, as seen in step 104. The system will also predict the next bit of data with a second predictive model, as seen in step 108. Note that more than two models may be employed. A model maps a context to a bit history using a hash table, then maps the history to a prediction using a direct lookup table. A bit history is a state representing the number of zeros and ones observed in a context and may also include the values of the most recent bits.

The system will then combine the predictions with a weighted content mixer or content mixing algorithms, as seen in step 112. Any number of content mixing algorithms or techniques may be utilized but the PAQ series is preferred. PAQ is a series of open source data compression archivers that have evolved through collaborative development to top rankings on several benchmarks measuring compression ratio. For example, PAQ7 or PAQ8 (or an earlier or later version of PAQ) by may be utilized. PAQ7 is especially preferable at the moment. Although the PAQ series is well known, for more information, please refer to M. V. Mahoney, *Adaptive Weighting of Context Models for Lossless Data Compression*, Florida Institute of Technology Technical Report CS-2005-16, 2005 (describing PAQ6), which is hereby incorporated by reference in the entirety, as are all documents referred to in this application.

After the predictions are combined using a weighted mixer the mixers' output may be adjusted with a series of secondary symbol estimation ("SSE") stages in step 116. An SSE stage inputs the current prediction and additional context and outputs a new prediction from a table.

In step 120 the (previously next) bit is arithmetically coded. An arithmetic coder encodes a bit with probability p using very nearly log2 1/p output bits, which would be optimal. It does this by maintaining a range (low, high), initially (0, 1), and as its final output, encodes the bit sequence as a fractional binary number within the final range. Each bit, y, is encoded by splitting the range into two parts in proportion to the two probabilities P(y=0) and P(y=1). Then the range is reduced by retaining only the half corresponding to y. For further information on encoding a bit with an arithmetic code, please refer to U.S. Pat. No. 4,122,440, entitled Method and Means for Arithmetic String Coding, issued to Langdon et al on Oct. 24, 1978, which is hereby incorporated by reference in the entirety.

In step 124, the predictive models are updated, and in step 128 the mixer weights are also updated to favor the most accurate models.

After the bit is coded, the history may also be updated (not shown), proportionally discarding counts as necessary to stay within a limited number of states. The prediction is also updated in proportion to the prediction error to reduce the error, as seen in step 132. Note that the updates of the predictive models, histories, and mixer weights may take place in any order, and not necessarily in the order shown.

Prior to coding, the mixer output may be further adjusted by a series of SSE (secondary symbol estimation) stages, as seen in step 116. An SSE stage inputs the current prediction and additional context and outputs a new prediction from a table. After the bit is coded, the table entry is adjusted in proportion to the prediction error. In practice, the input prediction is quantized on a nonlinear scale and the output is interpolated between two adjacent table entries. Then only the closer table entry is updated.

During decompression, the system makes an identical sequence of predictions using the previously decoded bits as context. That prediction is fed to the arithmetic coder to decode the next bit.

If lossy compression is chosen, the data values are rounded to a multiple of q prior to compression. Compressed file format and decompression are unaffected.

The system and compression/decompression techniques will now be discussed in greater detail with regard to FIG. 1B. For more detail please refer to the description of the individual component parts of the compressor.

Figure 1B:
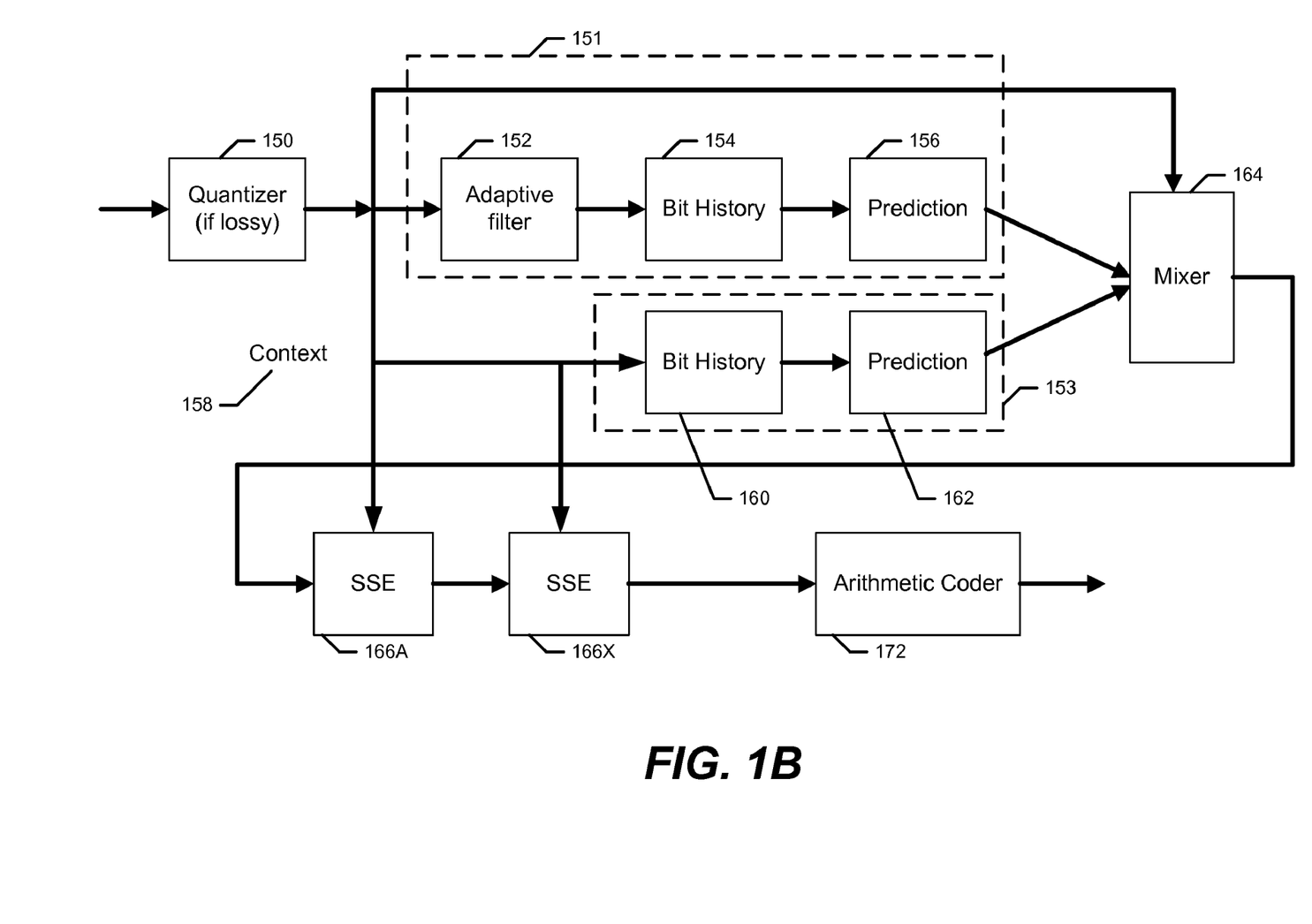
FIG. 1B is a block diagram of a compressor according to an embodiment of the invention.

The structure of an exemplary compressor embodiment is show in FIG. 1B. The depicted compressor embodiment uses two models 151 and 153 and two SSE stages 166A and 166B. The models 151 and 153 may alternatively be thought of and referred to as sub-models. The input is grouped into 32-bit words, coded most significant bit first (i.e. sign, exponent, mantissa). One model (e.g. 153) uses the more significant bits of the previous samples as context. The other (151) uses an adaptive filter to predict the next value and uses that prediction as context (158). The context 158 is provided and used by adaptive filter 152, bit history 154, prediction block 156, mixer 164, bit history 160, prediction block 162, and SSE stages 166A-x. These contexts are in addition to the previously coded bits of the current sample. Block headers are modeled separately from data using the position in the header as context.

Embodiments also encompass a decompressor similar to the compressor shown in FIG. 1B. The decompressor used in conjunction with the illustrated compressor differs in that: there is no quantizer; the arithmetic coder is replaced by a decoder; and the decoder output is fed back to the model at the point of the quantizer output.

As regards to the compressor of FIG. 1B, the input to the compressor is a series of numbers in floating point format. The input first passes through a quantizer 150 which rounds the values to a user selected power of 2. The quantizer may be bypassed in some embodiments or at the option of the user. Quantization results in lossy compression, as the rounding cannot be undone, but improves overall compression as the discarded data is generally noisy and difficult to compress.

After optional quantization, the data (as a bit stream) is input as context to the adaptive filter 152, the second model 153, the mixer 164, and SSE stages 166A-166x.

When the adaptive filter 152 receives the final bit of a numeric value, it outputs an approximate predicted value as context to the first bit history table 154. That prediction remains fixed until the final bit of the next value.

The first bit history table 154 receives additional input from the partially coded bits of the current numeric sample (input or output of quantizer 150). When combined with the adaptive filter prediction 152, it forms an index into a hash table which selects an 8 bit state representing a history of bits seen in the same context.

The second bit history hash table 160 receives as input the most significant bits of the last several, e.g. 3 numeric samples and the previously coded bits of the current sample.

The two histories from 154 and 160 index the two prediction tables 156 and 162 respectively. The output is a probability that the next bit will be a 1. The mixer 164 combines the two predictions according to a PAQ technique, preferably PAQ7. The two (optional) SSE stages 166A and 166x refine the prediction, also according to a PAQ technique, preferably PAQ7. The final prediction from SSE 166x is used by the arithmetic coder 172 to encode the output.

After coding, the histories 154 and 160 are updated to reflect the coded bit. The prediction tables 156 and 162 and SSE stages 166A and 166x are adjusted to reduce prediction error. The mixer 164 weights are adjusted to favor the more accurate of the two input predictions. After the last bit of a sample, the adaptive filter 152 weights are adjusted to reduce the prediction error.

Figure 1C:
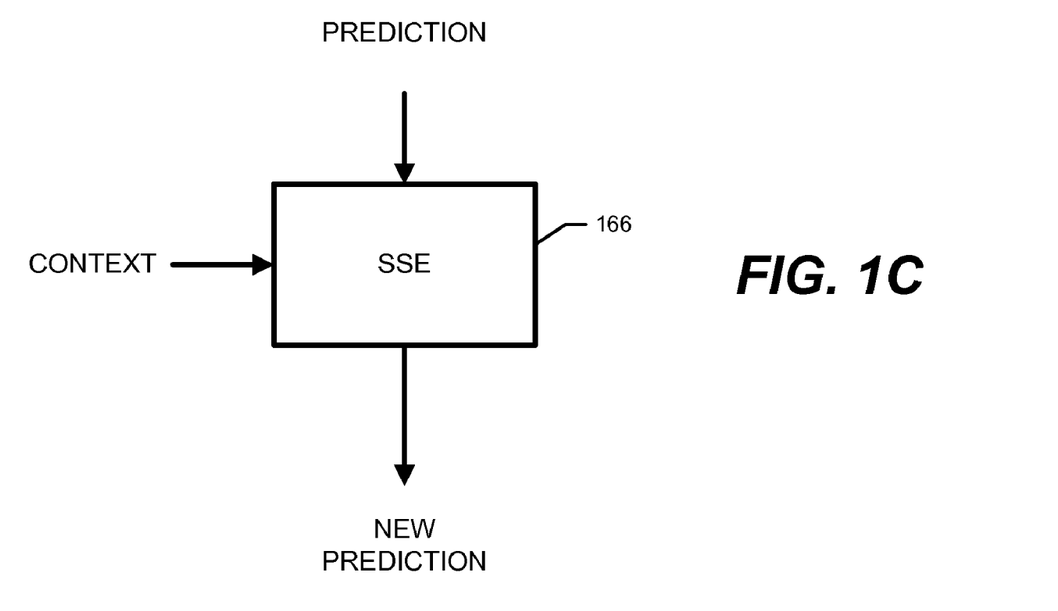
FIGS. 1C and 1D are functional diagrams relating to secondary symbol estimation stage(s) 166 and coder 172, respectively.
Figure 1D:
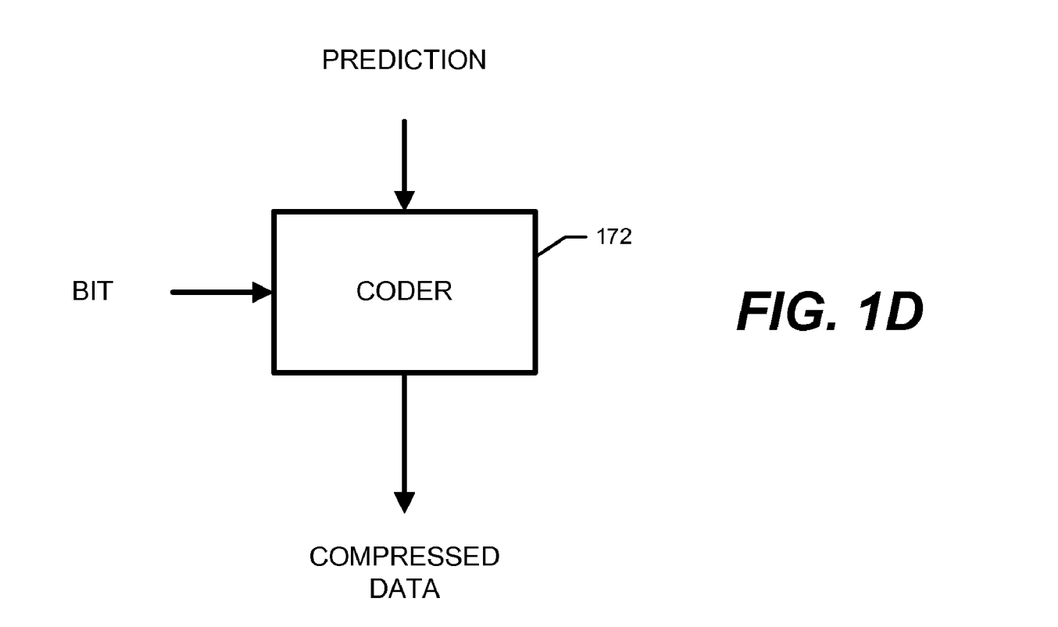

FIGS. 1C and 1D are functional diagrams relating to secondary symbol estimation stage(s) 166 and coder 172, respectively.

Component Parts of the Compressor

What follows is some additional description of the component parts of an exemplary implementation of the compressor. Note that the values discussed are for the described exemplary implementation, and would differ in different implementations. For example, samples with a larger bit size would call for different values etc.

Quantizer

The quantizer 150 is active only during compression and only if lossy mode is selected. It parses the input to determine whether it is reading a 32-bit sample or part of the header. If it is a sample then it is converted to a 32-bit float, rounded to the nearest multiple of q, and converted back into its original format (e.g. 32 bit IEEE or IBM floating point format). Header data is passed unchanged.

Adaptive Filter

The compressor uses a 9 (or other number) tap adaptive filter 152 to compute a predicted value to be used as context for one of the models. The filter output is computed as $x_p = \Sigma_{i=1 \ldots 9} w_i x_i$, where $w_i$ are the filter weights (initially 0)

and $x_i$ are the inputs. Inputs $x_1$ and $x_2$ are the first and second samples before $x_p$. Inputs $x_3$ through $x_9$ are adjacent differences rather than actual sample values. Input $x_3$ is the difference between the second and third sample before $x_p$. This continues to $x_9$ which is the difference between the eighth and ninth value.

Prior to computing differences and filter input, the samples are converted to integers by the formula $\text{int}(x_i 2^{SCALE})$ where SCALE is initially 40. The conversion to int( ) rounds toward zero. The output is clamped to a 32 bit signed range ($-2^-$ to $2^{31}-1$). Whenever this results in a value outside the range $-2^{24}+1$ to $2^{24}-1$, SCALE is decremented. This affects only later samples, not the current one. Conversion to integers avoids incompatibilities between the compressor and decompressor when run on machines with different floating point rounding errors. (The quantizer uses floating point arithmetic, but this does not introduce incompatibilities because it is not used during decompression).

After the signal $x_0$ is completely coded, the weights are updated to reduce the prediction error $x_0 - x_p$. For each weight, if $x_i$ has the same sign as the error, then $w_i$ is increased by $1/256$. If the signs are opposite, then $w_i$ is decreased by $1/256$. If either $x_i$ or the error is 0, then the weight is unchanged.

Models

There are two models, 151, and 153. Each model takes as input a hashed context and maps it to a bit history, then maps the history to a prediction for the next bit. After coding, both maps are updated. The bit history is updated to include the coded bit. The prediction table entry is updated to reduce the prediction error.

Define $c_{i,j\ldots k}$ as the context consisting of bits j through k of the i'th sample back from the one being currently coded. For example, $c_{0,31\ldots 24}$ means the first 8 bits of the current sample, and $c_1 = c_{1,31\ldots 0}$ means the entire previous sample. Then the two context hashes used to code bit k of the current sample are:

$$h_1 = \text{hash}(\text{int}(\text{sgn}(x_p) 4\log_2(|2^{-SCALE} x_p| + 1)), c_{0,31\ldots k+1}, k)$$

$$h_2 = \text{hash}(c_{3,31\ldots 23}, c_{2,31\ldots 23}, c_{1,31\ldots 23}, c_{0,31\ldots k+1}, k)$$
if $k$ in 31 ... 16
$= \text{hash}(c_{0,31\ldots k+1}, k)$ if $k$ in 15 ... 0.

where $\text{sgn}(x)=1$ if $x>0$, $-1$ if $x<0$, else 0. $h_1$ is a hash of the previously coded bits plus predicted value quantized to $1/4$ on a log scale. For the first 16 bits of $c_0$, $h_2$ is a hash of the upper 9 bits of the three previous values combined with the bits of $c_0$ already coded. For the last 16 bits, only the previously coded bits of $c_0$ are used. The upper 9 bits includes the sign and exponent in both IEEE and IBM formats, and also the high order mantissa bit in IBM format. Thus, the low (noisy) bits of the sample are coded in an order 0 context rather than a rounded order 3 context.

The model distinguishes numeric samples from headers. For headers, let $c_{i,j\ldots k}$ be defined on 32-bit words as before and let p be the bitwise position relative to the end of the header (which ranges from 0 to 1919 for a 240 byte header). Then the two contexts for modeling bit k of $c_0$ are:
$h_1 = \text{hash}(c_{0,31\ldots k+1}, k)$
$h_2 = \text{hash}(p \mod 2^{12}, c_{0,k+16\ldots k+1})$ Bit Histories A model maps a context to a bit history using a hash table. A bit history is an 8 bit state representing $(n_0, n_1, h)$, where $n_0$ and $n_1$ are counts of previously seen 0 and 1 bits respectively, and h is a string of the last 0 to 4 bits. In order to limit the number of states to $2^8 = 256$, it is necessary to restrict the length of the history string as follows:

If $n_0 + n_1 \leq 4$ then $|h| = n_0 + n_1$ (complete history for first 4 bits)
Else if $n_0 + n_1 \leq 15$ then $|h| = 1$ (only last bit is remembered)
Else $|h| = 0$ (no history string)
Also, it is necessary to restrict the bit counts as follows:
If $n_0 = 0$ then $n_1 \leq 41$.
If $n_0 = 1$ then $n_1 \leq 40$.
If $n_0 = 2$ then $n_1 \leq 12$.
If $n_0 = 3$ then $n_1 \leq 5$.
If $n_0 = 4$ then $n_1 \leq 4$.
If $n_0 > 4$ then the same restrictions apply swapping $n_0$ with $n_1$.

The result is 253 states. A bit history is updated using a 256 by 2 lookup table that inputs the current state and the bit to be appended. If the new state would exceed the constraints described above, then bits from the history string are discarded and the next state is the one with the largest possible counts that approximately preserve the ratio $n_0/n_1$.

Context Hash Table

Bit histories are stored in a hash table with $2^{26}$ (64M) 1-byte states. The table is shared by both models. A context is hashed to 32 bits, of which 22 bits are used as an index, 8 bits as a confirmation checksum, and 2 are not used. A hash element consists of a 16 byte array containing a checksum and 15 bit histories. A hash table lookup is done once per model per 4 bits (for k=31, 27, 23 ... 3). The first of the 15 elements represents the bit history in the current context. The remaining 14 data elements represent bit histories for the 14 possible contexts that result from appending 1, 2, or 3 bits of $c_0$ to the current context. This organization reduces the number of table lookups.

A table lookup consists of searching three adjacent elements for a matching 8 bit checksum by flipping bit 0 and then bit 1 of the hash index. This strategy keeps the search within a single 64-byte cache line to reduce cache misses. The table is aligned on a 64 byte address. If none of the three checksums match, then a least-frequently-used (LFU) replacement strategy is used. The total count ($n_0 + n_1$) of the first data element is used as a priority and the lowest value is replaced. To facilitate this, the states are ordered by increasing total count. State 0 represents the empty history, $n_0 = n_1 = 0$. The table is initially all zero bytes.

Prediction Map

A bit history is mapped to a prediction using a 256 element lookup table containing a prediction p (range 0 to 1, initially 1/2) that the next bit y will be a 1, and a count n (range 0 to some maximum L, initially 0) of the number of times p was updated. The output is p. After bit y is coded, n is incremented if less than L, and p is updated to $p + (y-p)/(n+1/2)$. This has the effect that $p = (n_1 + 1/2)/(n+1)$ while $n < L$, where $n_1$ is the number of updates where $y=1$. This is a stationary model weighting all bits equally. After L updates, the model becomes adaptive, eventually weighting the most recent bits more heavily over an exponentially decaying window with time constant L.

In one preferred embodiment, L=96, p is a 22 bit integer and n is a 10 bit integer. p and n are packed into one 32-bit integer. The division by (n+1/2) is accelerated by multiplying by the inverse from a table indexed by n.

Mixer

A mixer 164 combines two or more predictions plus some additional context and outputs a new prediction that the next bit y will be a 1. After coding y, the mixing weights are updated to reduce the prediction error by favoring the most accurate models in this context.

Specifically, the mixer is a single layer neural network trained to minimize coding cost. The model predictions $p_i$ are first stretched by the transform $x_i = \log(p_i/(1-p_i))$. The output is the squashed weighted average, $p = \text{squash}(w_i x_i)$, where $\text{squash}(x) = 1/(1+e^{-x})$ is the inverse of stretch(.). After a bit y is coded, the weights are updated in proportion to the prediction error times the input: $w_i := w_i + Rx_i(y-p)$, where the small positive constant R is the learning rate.

In the preferred embodiment, $R = 7/2048 \approx 0.0034$. There are two inputs. There are 64 contexts each selecting a different set of weights. The context is the bit position k (0 . . . 31) and one bit indicating whether the input is a data sample or part of a header. The squash(.) and stretch(.) functions are implemented using lookup tables. Probabilities are represented with 12 bits of resolution (0 to 4095). The output of stretch(.) is in the range −8 to 8 with an 8 bit fractional part (represented by −2047 to 2047).

SSE

Secondary symbol estimation inputs a prediction and additional context and outputs a new prediction. The output is interpolated between two adjacent entries on the probability axis of a 2 dimensional table containing p and n as in a prediction map. After a bit is coded, the table entry nearest the input probability is updated the same way.

The interpolation is as follows. An input prediction p is stretched and two nearest values $s_1$ and $s_2$ are computed such that $-8 \leq s_1 \leq \text{stretch}(p) < s_2 \leq 8$, and $s_1$ and $s_2$ are adjacent integral multiples of 16/23 in this range. There are 24 such values (−8, −8+16/23, −8+32/23, . . . 8). Then an interpolation weight is computed: $w = (\text{stretch}(p) - s_1)(s_2 - s_1)$. Then the corresponding values $p_1$ and $p_2$ are looked up, and the output is $(1-w)p_1 + wp_2$.

After bit y is coded, if w<1/2 then $p_1$ and $n_1$ are updated as in a prediction map, otherwise $p_2$ and $n_2$ are updated.

In the preferred embodiment, there are multiple SSE stages, represented by stages 166A-x, after the mixer. Define d as a bit indicating whether the input is a data sample or part of a header. The first stage models bit k using $c_{0,k+4,k+1}$, k, and d as context (total 10 bits). The second stage uses k, $c_{0,29\ldots 23}$, and d (total 13 bits) as context. This context includes only the low 7 bits of the exponent of $c_0$ in IEEE format, or low 6 bits plus first mantissa bit in IBM format. It excludes the sign bit.

The output of the first stage is averaged with its input with the output weighted 75%. In other words, the output to the arithmetic coder is SSE2(3/4 SSE1(p)+p/4) where p is the input from the mixer.

Arithmetic Coder

An arithmetic coder 172 codes a string s as a binary number x in [0,1) such that for a string y chosen at random from the distribution modeled by the compressor, $P(y<s) \leq x < P(y \leq s)$ and string comparison is lexicographically ordered. Such a number can always be found such that the number of bits |x| in x satisfies $|x| < \log_2(1/P(s)) + 1$, or within one bit of the Shannon limit, which is the best one can do.

An arithmetic code can be computed efficiently by representing P(s) as a series of predictions, $P(s_{1\ldots n}) = P(s_1)P(s_2|s_1) P(s_3|s_{1\ldots 2})P(s_4|s_{1\ldots 3}) \ldots P(s_n|s_{1\ldots n-1})$ where $s_i$ is the i'th symbol in s. The coder maintains a range $[x_1, x_2)$ of possible x (initially [0,1)) given the symbols coded so far. For each prediction $P(s_i)$, the range is divided in proportion to the probabilities assigned to each of the possible values of $s_i$. Then the actual value is coded by replacing the current range with the smaller subrange corresponding to that value. As $x_1$ and $x_2$ converge to x, the leading bits of x can be output without waiting for compression to finish.

Decompression consists of making an identical series of predictions (using previously decoded symbols as context) and dividing the range as before. Then the coder reads x to select one of the subranges and outputs the corresponding symbol.

In the preferred embodiment, symbols are bits, and $[x_1, x_2)$ are integers in the range 0 to $2^{32}-1$. The range is split at $x_m = x_1 + p(x_2 - x_1 - 1)$, where p is the probability that the next bit is 1. A 1 is coded by making the new range $[x_1, x_m)$. A 0 is coded by making the new range $[x_m+1, x_2)$. Whenever the high 8 bits of $x_1$ and $x_2$ are identical, they are shifted out to the output file, zeros are shifted into the low 8 bits of $x_1$ and ones are shifted into the low 8 bits of $x_2$.

Embodiments also encompass a decompressor similar to the compressor shown in FIG. 1B. The decompressor used in conjunction with the illustrated compressor differs in that: there is no quantizer; the arithmetic coder is replaced by a decoder; and the decoder output is fed back to the model at the point of the quantizer output.

As mentioned, decoding proceeds as follows. The predictor, which includes the set of models, mixer, and optional SSE stages, makes an identical series of predictions using the decoded output bit stream as input. These predictions are fed to an arithmetic decoder, which takes the compressed data stream as input. The decoder, like the encoder, maintains a range (low, high), initially (0, 1), and makes an identical series of range splits and reductions. To decode a bit, the input number is compared with the two halves of the split. If the input is in the half corresponding to P(y=0), then a 0 is output, else a 1 is output, and the selected half becomes the new range.

While the invention has been particularly shown and described with reference to specific embodiments thereof, it will be understood by those skilled in the art that changes in the form and details of the disclosed embodiments may be made without departing from the spirit or scope of the invention.

In addition, although various advantages, aspects, and objects of the present invention have been discussed herein with reference to various embodiments, it will be understood that the scope of the invention should not be limited by reference to such advantages, aspects, and objects. Rather, the scope of the invention should be determined with reference to the appended claims.

What is claimed is:

1. A computer system configured to compress and decompress data, the system comprising a processor and a memory, and configured by instructions in the memory when executed by the processor to:

receive a one dimensional time series of floating point numbers as an input;

predict with a plurality of submodels what the next bit of the input sequence will be, before it is compressed, to form a plurality of predictions, where one or more of the submodels uses an adaptive filter to compute all or part of its context;

combine said plurality of predictions with a mixer to produce a combined prediction;

refine the combined prediction using zero or more secondary symbol estimator (SSE) stages;

code the bit dependent on an output of a final of the SSE stages;

update said submodels to reduce their respective prediction errors;

update said mixer to favor a more accurate of the submodels;

update said SSE stages to reduce their respective output prediction errors; and if the coded bit is the last bit of a floating point number, update the weights of all adaptive filters to reduce their respective prediction errors.

2. The computer system of claim 1, wherein the system is further configured to quantize the received input by rounding each floating point value to the nearest multiple of a fixed input value prior to coding.

3. A computer system configured to compress and decompress data, the system comprising a processor and a memory, and configured by instructions in the memory when executed by the processor to:

receive a one dimensional time series of floating point numbers as an input;

predict with a plurality of submodels what the next bit of the input sequence will be, before it is compressed, to form a plurality of predictions, where one or more of the submodels uses an adaptive filter to compute all or part of its context;

combine said plurality of predictions with a mixer to produce a combined prediction;

code the bit dependent upon the combined prediction;

update said submodels to reduce their respective prediction errors;

update said mixer to favor a more accurate of the submodels; and if the coded bit is the last bit of a floating point number, update the weights of all adaptive filters to reduce their respective prediction errors.

4. The computer system of claim 3, wherein the system is further configured to quantize the received input by rounding each floating point value to the nearest multiple of a fixed input value prior to coding.

5. The computer system of claim 3, wherein the computer system is further configured to refine the combined prediction using one or more secondary symbol estimator (SSE) stages.

6. The computer system of claim 5, wherein the computer system is further configured to update said SSE stages to reduce their respective output prediction errors.

7. A computer system configured to compress and decompress data, the system comprising a processor and a memory, and configured by instructions in the memory when executed by the processor to:

receive compressed data as an input;

predict with a plurality of submodels what the next bit of the output sequence will be, before it is decompressed, to form a plurality of predictions, where one or more of the submodels uses an adaptive filter to compute all or part of its context;

combine said plurality of predictions with a mixer to produce a combined prediction;

refine the combined prediction using one or more secondary symbol estimator (SSE) stages;

decode the bit dependent on an output of a final of the SSE stages or the mixer;

update said submodels to reduce their respective prediction errors;

update said mixer to favor a more accurate of the submodels;

update said SSE stages to reduce their respective output prediction errors; and if the decoded bit is the last bit of a floating point number, update the weights of all adaptive filters to reduce their respective prediction errors.

* * * * *